United States Patent
Niu et al.

(10) Patent No.: US 9,041,172 B1
(45) Date of Patent: May 26, 2015

(54) SEMICONDUCTOR DEVICE FOR RESTRAINING CREEP-AGE PHENOMENON AND FABRICATING METHOD THEREOF

(71) Applicants: Zhi Qiang Niu, Santa Clara, CA (US); Hamza Yilmaz, Saratoga, CA (US); Jun Lu, San Jose, CA (US); Fei Wang, Cupertino, CA (US)

(72) Inventors: Zhi Qiang Niu, Santa Clara, CA (US); Hamza Yilmaz, Saratoga, CA (US); Jun Lu, San Jose, CA (US); Fei Wang, Cupertino, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 14/105,473

(22) Filed: Dec. 13, 2013

(51) Int. Cl.
*H01L 23/495* (2006.01)
(52) U.S. Cl.
CPC .... *H01L 23/49503* (2013.01); *H01L 23/49575* (2013.01); *H01L 23/49534* (2013.01)
(58) Field of Classification Search
CPC ............................................. H01L 2224/92247
USPC ........................... 257/676, 691, 693, E23.031
See application file for complete search history.

(56) References Cited

U.S. PATENT DOCUMENTS

| | | | | |
|---|---|---|---|---|
| 6,362,517 | B1* | 3/2002 | Bell et al. ...................... | 257/678 |
| 6,667,547 | B2* | 12/2003 | Woodworth et al. ......... | 257/696 |
| 8,324,025 | B2* | 12/2012 | Saboco ......................... | 438/111 |
| 2013/0334677 | A1* | 12/2013 | Otremba et al. .............. | 257/706 |
| 2014/0145318 | A1* | 5/2014 | Otremba et al. .............. | 257/670 |
| 2014/0225661 | A1* | 8/2014 | Otremba ....................... | 327/530 |

* cited by examiner

*Primary Examiner* — Kyoung Lee
*Assistant Examiner* — Chi-Hua Yang
(74) *Attorney, Agent, or Firm* — Chein-Hwa Tsao; CH Emily LLC

(57) ABSTRACT

The present invention relates generally to a semiconductor device and, more specifically, to optimizing the creep-age distance of the power semiconductor device and a preparation method thereof. The power semiconductor device includes a chip mounting unit with a die paddle and a plurality of leads arranged side by side located close to one side edge of the die paddle in a non-equidistant manner, a semiconductor chip attached on the die paddle, and a plastic packaging body covering the die paddle, the semiconductor chip, where the plastic packing body includes a plastic extension portion covering at least a part of a lead shoulder of a lead to obtain better electrical safety distance between the terminals of the semiconductor device, thus voltage creep-age distance of the device is increased.

20 Claims, 13 Drawing Sheets ness of the lead distance is very limited;

SEMICONDUCTOR DEVICE FOR RESTRAINING CREEP-AGE PHENOMENON AND FABRICATING METHOD THEREOF

FIELD OF PRESENT INVENTION

The present invention generally relates to a semiconductor device, in particular, the present invention aims at providing a power semiconductor device for optimizing an electric clearance and increasing a voltage creep-age distance and a fabricating method thereof, in order to obtain a better electric safety distance between different terminals of the semiconductor device.

BACKGROUND OF RELATED ART

In a traditional power semiconductor device, a large current is generally flowed or a high voltage is applied through the leads of the device. In addition, with the development of main stream technology, the device size often needs to be minimized, which causes the insulating materials surrounding the leads being extremely closer to each other and subjected to electric polarization, so that the insulating materials are electrified to affect the normal operation of the device, or to cause the potential safety hazards; particularly, a creep-age phenomenon is increased under humidity or dust environments. In standard for safety of electric appliances in North America, ANSI/UL standard is commonly used for evaluation. An electric safety distance is a standard requirement for safety of electric appliances. For restraining the creep-age phenomenon, it is important to control the electric clearance or the creep-age distance and other related parameters.

A conventional TO-220 device is as shown in FIG. 1A. The die paddle of the power device for attaching the power MOSFET (Metal-Oxide-Semiconductor Field Effect Transistor) chips are all completely sealed in a plastic package body 10. Leads 11-13 and a heat sink 14 are all exposed out of the plastic package body 10. The outer leads 11 and 13 are separated from the die paddle as a gate lead and a source lead respectively, the inner lead 12 is generally connected with the die paddle as a drain lead. The leads 11-13 are arranged in side by side with equidistance. In this device, the leads 11-13 are much closer to each other so that their creep-age distance does not comply with the requirements under a high voltage condition, for example, a distance between a symmetric center line of the lead 12 along its length direction and that of the leads 11 or 13 along its length direction is about 2.54 mm, while the narrowest distance between the part of the lead 12 closest to the plastic package body and the part of the lead 11 (or 13) closest to the plastic package body is only about 1.27 mm, thus, such lead distance is very likely to cause the creep-age phenomenon. To overcome this problem, U.S. Pat. No. 6,255,722B1 discloses a device structure as shown in FIG. 1B. In FIG. 1B, fine slots 70 and 71 are formed on the side face of a plastic package body 60 between an inner lead 24 and two outer leads 23 and 25 at its both sides. The fine slot 70 increases the creep-age distance between the leads 23 and 24, and the fine slot 71 increases the creep-age distance between the leads 24 and 25. In addition, in U.S. Pat. No. 6,291,262B1, a slot body is formed in a side wall of a plastic package body 50 located between two outer leads 38 (as shown in top view of FIG. 1C-1), furthermore, the inner lead 44 and the outer leads 38 are respectively arranged on different horizontal planes (as shown in side view of FIG. 1C-2), thus a creep-age distance can also be adjusted.

However, in the conventional devices described above, the method of changing the creep-age distance is very limited; especially it cannot restrain the creep-age phenomenon under the harsh environment when a high voltage is applied on the drain lead or source lead. Based on these problems, various embodiments provided in the invention are proposed.

BRIEF DESCRIPTIONS OF THE DRAWINGS

The embodiment of the present invention is more sufficiently described hereunder with reference to attached drawings. However, the attached drawings are only used for explaining and illustrating rather than limiting the scope of the present invention.

FIG. 1A is a top view of a conventional packaging mode for TO-220 series.

FIG. 1B is a schematic diagram of a conventional packaging mode with a creep-age distance increased disclosed by U.S. Pat. No. 6,255,722B1.

FIGS. 1C-1 to 1C-2 are schematic diagram of a conventional packaging mode with a creep-age distance increased disclosed by U.S. Pat. No. 6,291,262B1.

DESCRIPTIONS OF THE SPECIFIC EMBODIMENTS

Figure 1A:
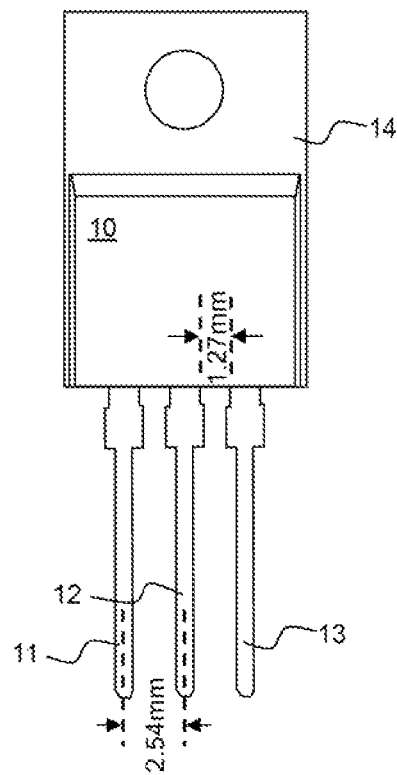
Figure 1B:
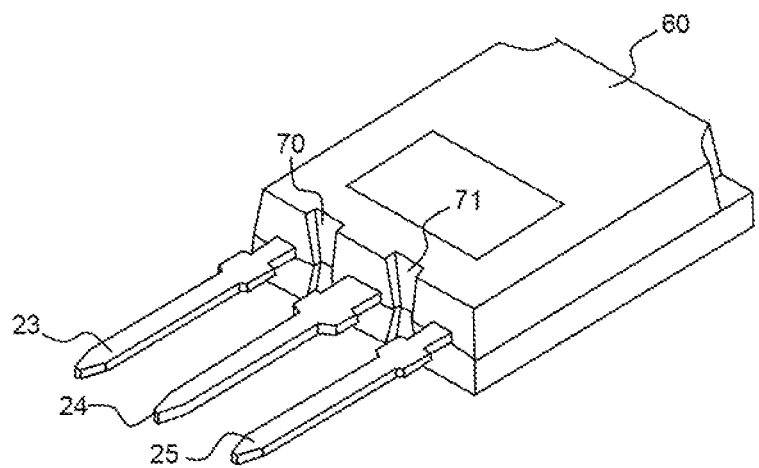
Figures 1, 1C:
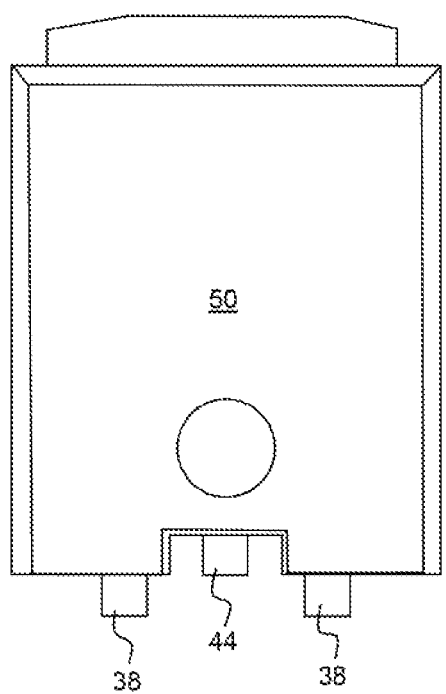
Figures 1, 1C, 2:
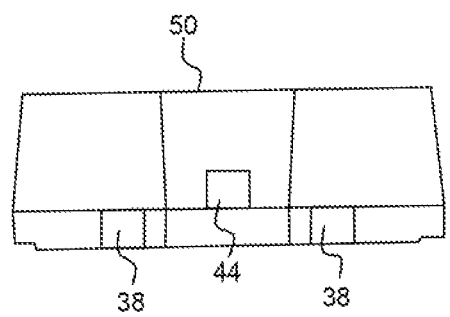
FIG. 2 is a top view of a lead frame of the present invention.
Figure 2:
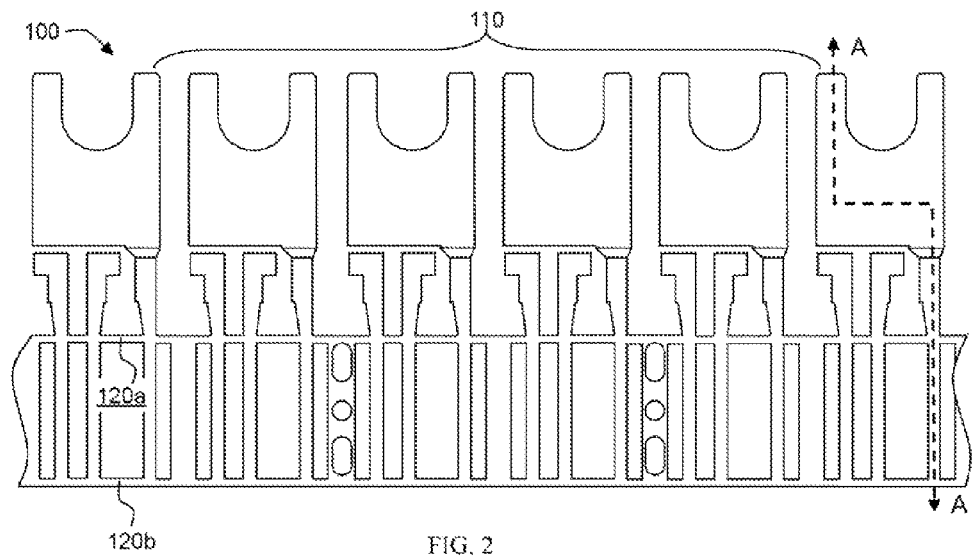
Figure 3A:
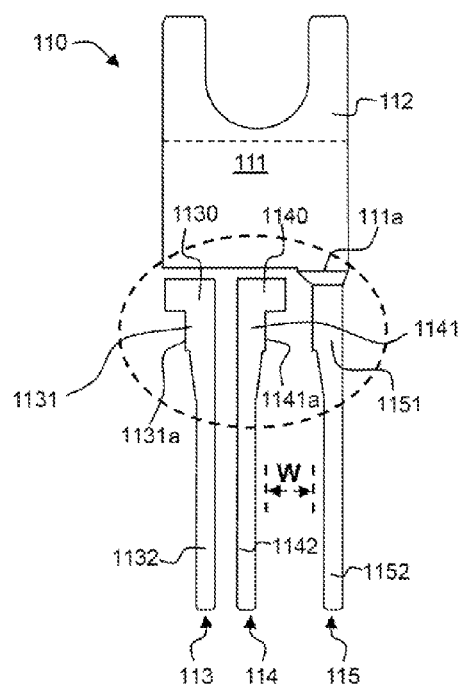
FIGS. 3A-3B are top view and cross-sectional view of a chip mounting unit contained in the lead frame.

A part of a metal lead frame 100 is shown in FIG. 2, which is a standard TO single-row straight plugging package lead frame generally including a plurality of chip mounting units 110, one of which is shown in FIG. 3A. Each chip mounting unit 110 at least includes a square die paddle 111 for attaching a semiconductor chip. A plurality of leads 113, 114 and 115 arranged side by side closed to an edge 111a of the die paddle 111, wherein the leads 113 and 114 are separated from the die paddle 111, while the lead 115 is connected with the die paddle 111, and the lead 114 is arranged in between and adjacent to the leads 113 and 115. A fork-shaped heat sink 112 having a notch is connected with the die paddle 111 at the opposite edge relative to the edge 111a. The inner side of the notch is in arc shape or close to a semicircle, which can be used for positioning the lead frame 100. It should be noted that the heat sink 112 described hereby is only one of a plurality selection modes, so that it shall not be limited.

In FIG. 3A, lead 113 includes a lead shoulder 1131 in strip-shape connected to a bonding area 1130 at its inside end close to the die paddle 111 and a lead terminal 1132, which is also in the strip-shape, at outside end of the lead shoulder 1131. Similarly, lead 114 includes a lead shoulder 1141 in strip-shape connected to a bonding area 1130 at its inside end close to the die paddle 111 and a lead terminal 1132, which is also in the strip-shape, at its outside end. Lead 115 includes a lead shoulder 1151, in strip-shape, at its inside end connected to the edge 111a of the die paddle 111 and a lead terminal 1152, which is also in the strip-shape, at the outside end. In FIG. 3A, lead 115 is arranged near the end of the edge 111a, and in fact, the die paddle 111, the heat sink 112 and the lead 115 are an integrated piece. The directions extending along the length of the lead shoulders 1131-1151 and the lead terminals 1132-1152 are perpendicular to the length direction of the edge 111a. The bonding areas 1130 and 1140 of leads 113 and 114 are separated from the die paddle 111 and are used for connecting with the electrode terminals of a semiconductor chip through conductive structures, where the conductive structures include, but not limited to, bonding wires or metal clip or metal stripe and so on; in addition, both of the bonding areas 1130 and 1140 extend along the longitudinal direction of edge 111a for increasing their contact areas, and thus increasing the number of bonding wires connecting on them. In one embodiment of the present invention, the lead 115 connected with the die paddle 111 is not arranged between the leads 113 and 114 separated from the die paddle. The leads 113 and 114 are arranged at one side, either left side or right side, of the lead 115.

In some power management circuits, the drain electrode of an N-channel MOSFET is connected with a high voltage while the source electrode and the gate electrode are connected with low voltage, by way of example, the drain electrode disposed at the bottom of a vertical N-type MOSFET is in electric connection with the die paddle 111, as such the lead 115 is electrically connected with the high voltage of the drain electrode. Leads 113,114 are arranged close to each other so that the distance between lead 113 and lead 114 is reduced to a minimum distance, thus leads 113 and 114 together form a designated group of leads, and the distance between the two adjacent leads 113 and 114 is smaller than the distance between any one of leads (113 or 114) of the group of leads and the lead 115 of the plurality of leads 113, 114 and 115, as such the plurality of leads 113, 114 and 15 are arranged in a non-equidistant manner. One of the leads 113 and 114 is connected with the source electrode of the vertical N-type MOSFET, therefore, the distance between the source electrode and the drain electrode can be extended as long as the distance between group of leads 113, 114 and lead 115 is increased, which improves the creep-age distance. This will be described in detail in the following contents.

In FIG. 3A, the outer lead 113 and the inner lead 114, separated from the die paddle 111, are close to each other but the inner lead 114 is far away from the lead 115 connected with the die paddle 111. In a preferred embodiment, the distance between the lead 114 and the lead 113 is minimized, which depends on the technology precision of a punching machine or an etching equipment for manufacturing the lead frame. In FIG. 3A, the lead 113 also includes an angle portion 1131a, on the side edge of the lead shoulder 1131 further from the lead 114, and the lead 114 also includes an angle portion 1141a on the side edge of the lead shoulder 1141 further from the lead 113 or the angle portion 1141a moving close to the lead 115 and moving close to the die paddle 111. Furthermore, the lead 115 can include the angle portions at one or two side edges of the lead shoulder 1151. The angle portions increase the mechanical strength of the lead, in particular to the lead shoulder in order to prevent their deformation. However, the angle portions are not required. Without the angle portions, the lead shoulders 1131, 1141 and 1151 are respectively as wide as the lead terminals 1132, 1142 and 1152. In this embodiment, one side edge of the bonding area 1130 close to the lead 114 is lined up with the side edge of the lead shoulder 1131 close to the lead 114 as well as one side edge of the lead terminal 1132 close to the lead 114. In addition, one side edge of the bonding area 1140 close to the lead 113 is lined up with the side edge of the lead shoulder 1141 close to the lead 113 as well as one side edge of the lead terminal 1142 close to the lead 113. As a result, an edge of the lead 114 adjacent to the lead 113 extending substantially parallel to an edge of the lead 113 adjacent to the lead 114 along a substantial length of the lead 114 from inside the plastic package body to outside the plastic package body. Such structure can minimize the distance between the lead 113 and the lead 114; thus, it can maximize the distance between the lead 114 and the lead 115. Moreover, the angle portions s can be arranged on one or both side edges of the lead shoulders 1131-1151 respectively (not shown); in addition, the bonding areas 1130 and 1140 along the edge 111a is not limited as shown in this figure. The both side edges of the bonding area 1130 can either correspondingly protrude out of the side edges of the lead shoulder 1131 or can be lined up with them, and both side edges of the bonding area 1140 can either protrude out of the side edges of the lead shoulder 1141 or can be lined up with them.

Figure 3B:
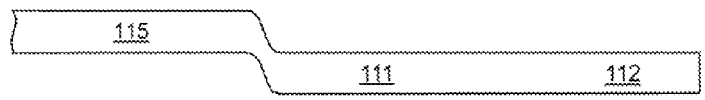

FIG. 3B is a cross-sectional view of the chip mounting unit 110 along a dotted line AA in FIG. 2. The leads 113, 114 and 115 are coplanar, and the die paddle 111 and the heat sink 112 are coplanar, where all leads 113-115 and the die paddle 111 are located on two staggered planes respectively.

A method for fabricating the semiconductor device capable of restraining the creep-age phenomenon is shown in FIG. 4A to FIG. 4C-3. In the lead frame 100, a number of dam-bars are provided for physical support in order to fix these chip mounting units 110 to prevent them from being greatly deformed in their transporting or processing steps. The free ends of the lead terminals 1132-1152 of each of leads 113-115 of each chip mounting unit are all connected with one dam-bar 120b of the lead frame 100, and the lead terminals 1132-1152 can be inserted into jacks of a socket arranged on a PCB (Printed Circuit Board) after each chip mounting unit is separated from the lead frame. The other dam-bar 120a of the lead frame 100 is also connected with the lead terminal (1132, or 1142 and 1152) of each lead (113 or 114 and 115). The dam-bar 120a is connected with the opposite end of the lead terminal (1132, or 1142 and 1152) close to the lead shoulder 1131 (or 1141 and 1151). The separated dam-bars 120a and 120b are arranged in parallel to each other.

Figure 4A:
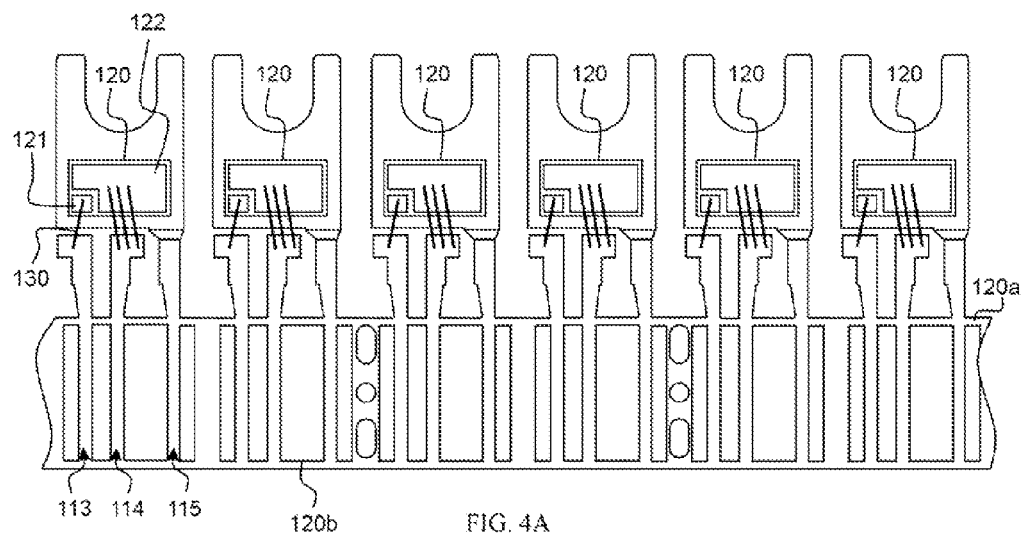
FIGS. 4A to 4C-3 are schematic diagrams showing a method for preparing a semiconductor device of the present invention.
Figure 4B:
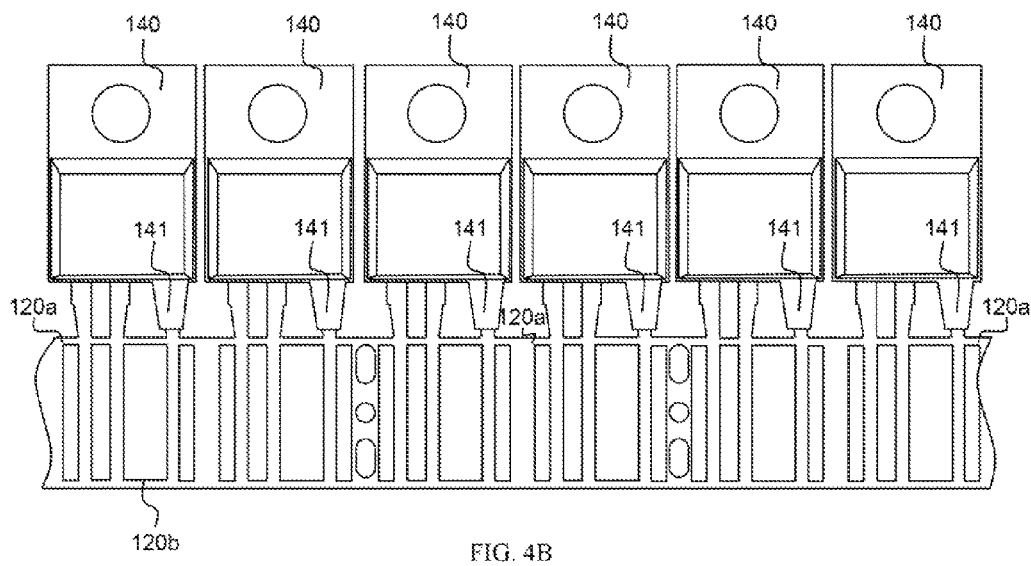
Figures 1, 4C:
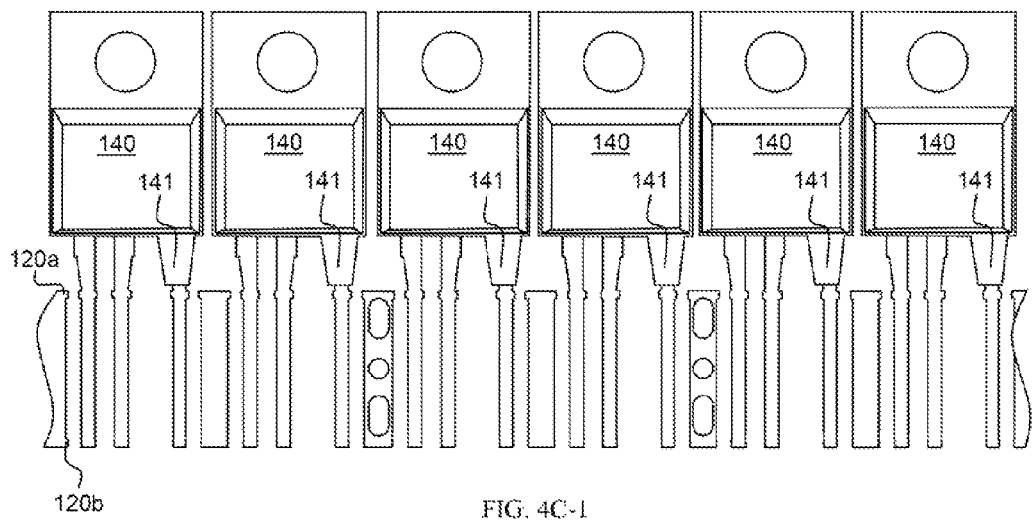
Figures 2, 4C:
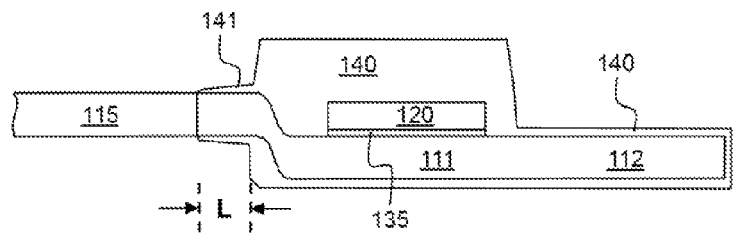
Figures 3, 4C:
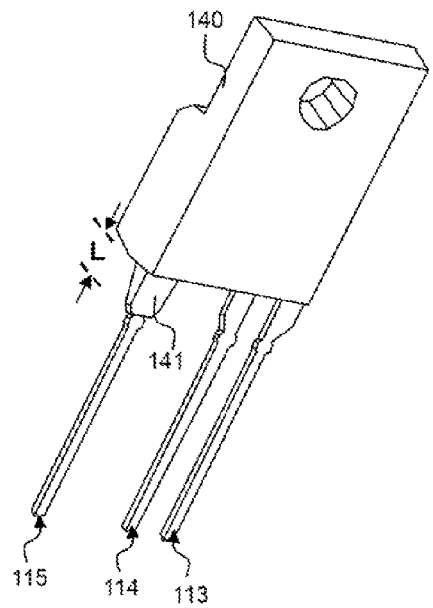

In FIG. 4A, a die attach step is performed: the plurality of power MOSFET chips 120 are attached on the plurality of die paddle 111 one-to-one via conductive adhesive materials and a bottom drain electrode disposed on the bottom surface of each chip 120 is in electric connection with the die paddle 111 via the adhesive material. Then, a wire bonding technology is applied: a gate electrode 121 at the front-side of the chip 120 is in electric connection with the bonding area 1130 of the lead 113 via a bonding wire 130 and a source electrode 122 at the front-side of the chip 120 is in electric connection with the bonding area 1140 of the lead 114 via the plurality of bonding wires 130, where the bonding wires 130 can be replaced by metal clip or metal strip and other similar conductive structures. Alternatively, the positions of the gate electrode 121 and the source electrode 122 can be exchanged, so the gate electrode 121 can also be in electric connection with the bonding area 1140 and the source electrode 122 can also be in electric connection with the bonding area 1130. As shown in FIG. 4B, a plastic package body 140 is formed by a plastic packaging material like epoxy resin or other molding compound to encapsulate the chip mounting units 110, the chips 120 and the bonding wires 130, where the plastic package body at least encapsulates the die paddle 111 as well as the bonding areas 1130 and 1140. In this present invention, the plastic package body 140 includes a plastic extension portion 141, the plastic package body 140 and the plastic extension portion 141 are an integrated piece, and at least a part of the lead shoulder 1151 of one lead 115 is encapsulated by the plastic extension portion 141. The lead shoulders 1131-1141 are not encapsulated by any plastic extension portion. In FIG. 4C-1, a sawing process of lead frame is performed, in which the dam-bars 120a and 120b are punched to cut off and separate the leads (113 or 114 and 115), therefore, the chip mounting unit 110 is separate from the lead frame 100. In particular, after the completion of molding process, a step of plating a metal layer for protecting or improving electric contact of the leads 113-115 exposing form the plastic package body 140 is performed, and finally the dam-bar 120a and 120b are cutoff to separate the semiconductor device as shown in FIG. 4C-3. Some detailed standard procedures that are known very well in the industry need not be described here.

FIG. 4C-2 is a cross-sectional view along of the dotted line AA in FIG. 2, with the molding process being completed, wherein the chip 120 is attached on the top surface of the die paddle 111 via a conductive adhesive material 135 like solder paste or conductive silver paste, and then the die paddle 111, the heat sink 112 and the chip 120 are completely encapsulated by the plastic package body 140, and the respective bonding areas 1130 and the 1140 of the leads 113 and 114 are also sealed in the plastic package body 140. As shown in this figure, the plastic extension portion 141 has taper shape and is much thinner than the thickness of the plastic package body 140 and extends outward from the plastic package body edge sidewall close to the leads. A length of the plastic extension portion 141 (L) is externally extending along the length direction of the lead shoulder 1151. Referencing to FIG. 3A and FIG. 4C-3, if a distance at the narrowest part between the lead shoulder 1141 and the lead shoulder 1151 is W, the effective creep-age distance of the present invention is substantially the sum of L and W. By way of example, and not by way of limitation, if the overall size of the semiconductor device in FIG. 4C-3 is the same as that of the device in FIG. 1A, L can be generally up to 2-4 mm, and W can also be up to 2-4 mm, so the minimum creep-age distance of FIG. 4C-3 is about 4 mm, comparing to the creep-age distance in FIG. 1A only about 1.27 mm. As such, the creep-age distance is improved.

Figure 5A:
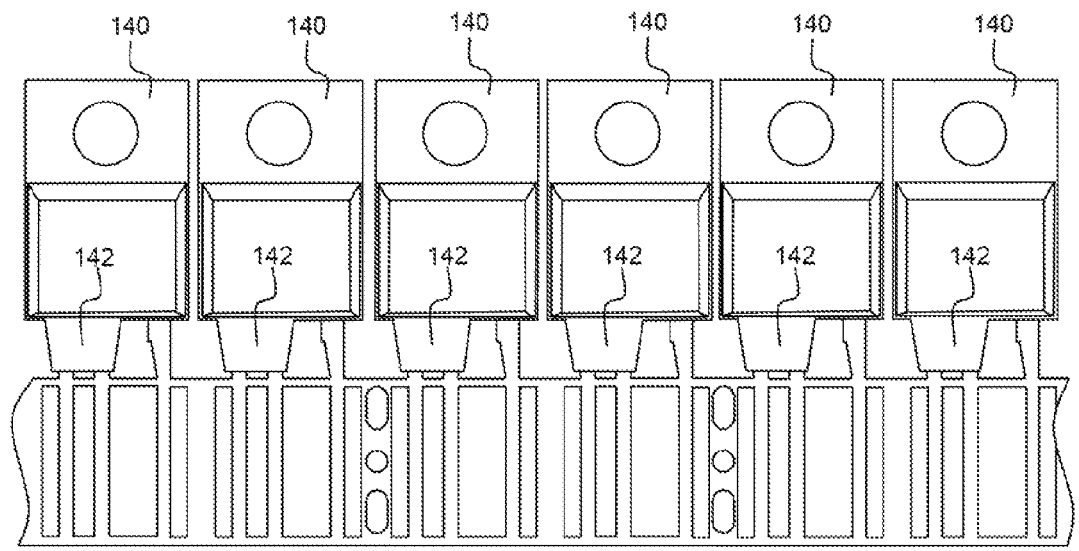
FIGS. 5A-5B are schematic diagrams showing an alternative method for preparing a semiconductor device of the present invention based on the method of FIGS. 4A to 4C-3.
Figure 5B:
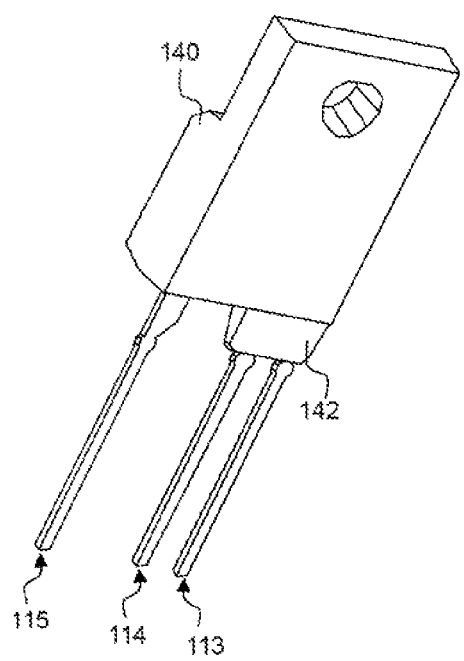

In an alternative embodiment, FIGS. 5A to 5B are similar as FIGS. 4B and 4C-3, which can be formed with the same process as shown in FIGS. 4A to 4C-1, excepting that the lead shoulder 1151 of the lead 115 is not encapsulated by the plastic extension portion 141, but instead the plastic package body 140 includes another plastic extension portion 142 extending along the length direction of the lead 113 (or 114 and 115). As described above, leads 113 and 114 separated from the die paddle 111 are close to each other and far away from the lead 115 connected with the die paddle 111. In this condition, the plastic extension portion 142 encapsulates the respective lead shoulders 1131 and 1141 of the leads 113 and 114, in which both the lead shoulders 1131 and 1141 can be encapsulated completely or partially, so that the volume size of the plastic extension portion 142 is slightly larger than that of the plastic extension portion 141 encapsulated only one lead shoulder 1151. The lead shoulder 1151 is not encapsulated by any plastic extension portion.

Figure 6A:
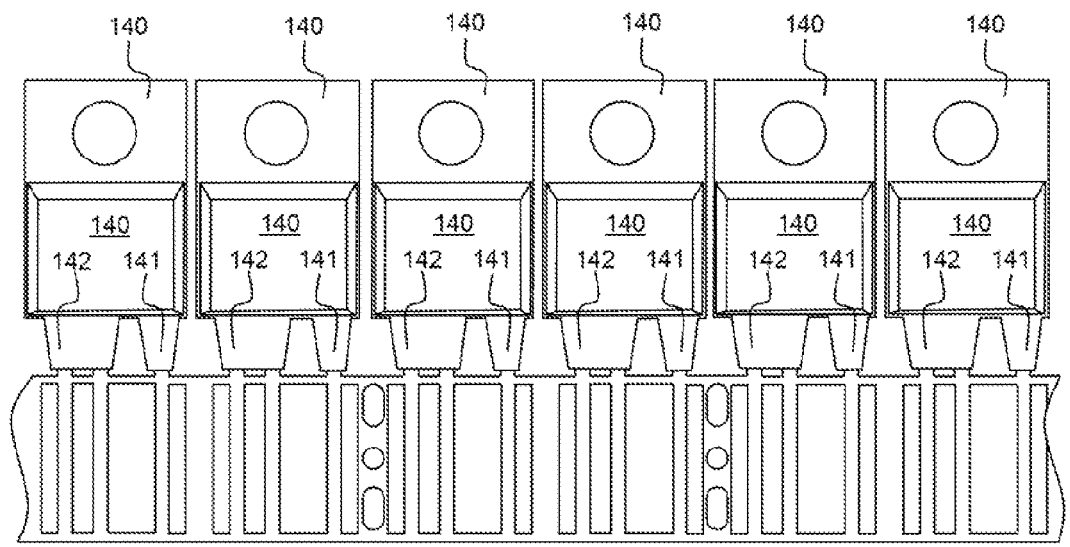
FIGS. 6A-6B are schematic diagrams showing another alternative method for preparing a semiconductor device of the present invention based on the method of FIGS. 4A to 4C-3.
Figure 6B:
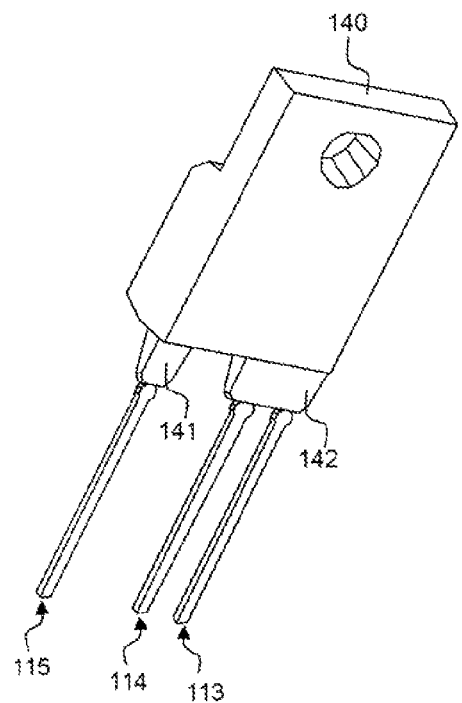

In another alternative embodiment, FIGS. 6A to 6B are also similar as FIGS. 4B and 4C-3, which can be formed with the same process as shown in FIGS. 4A to 4C-1, excepting that the plastic package body 140 includes both plastic extension portions 141 and 142, the lead shoulder 1151 of the lead 115 is encapsulated by plastic extension portions 141, and the lead shoulders 1131 and 1141 of the group of leads 113 and 114 are encapsulated by the plastic extension portion 142. If the length of the plastic extension portion 142 extending along the length direction of each lead 113 is also L, the actual creep-age distance in FIG. 6B, in respect to FIG. 5B, is approximately as 2 L plus W.

Figure 7A:
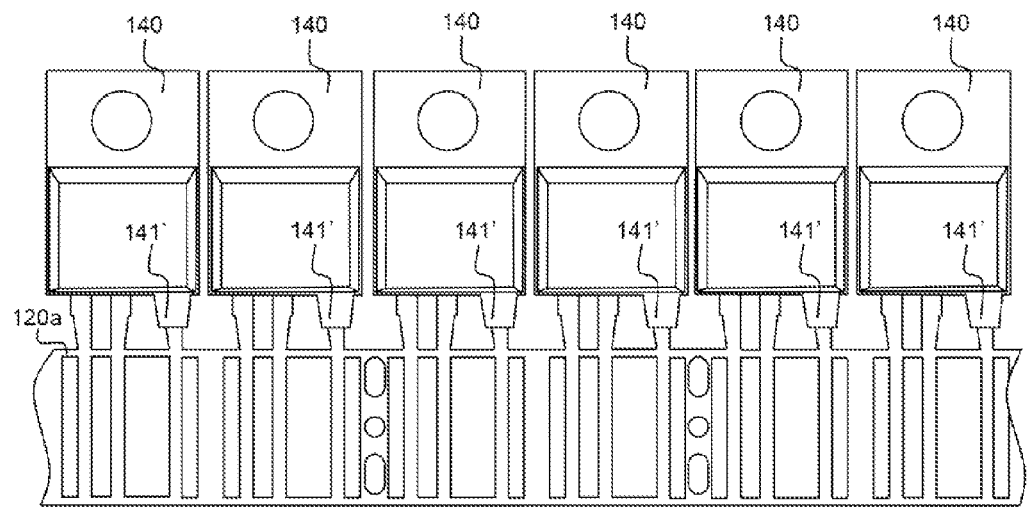
FIGS. 7A-7B are schematic diagrams showing a method for adjusting effective creep-age distance.
Figure 7B:
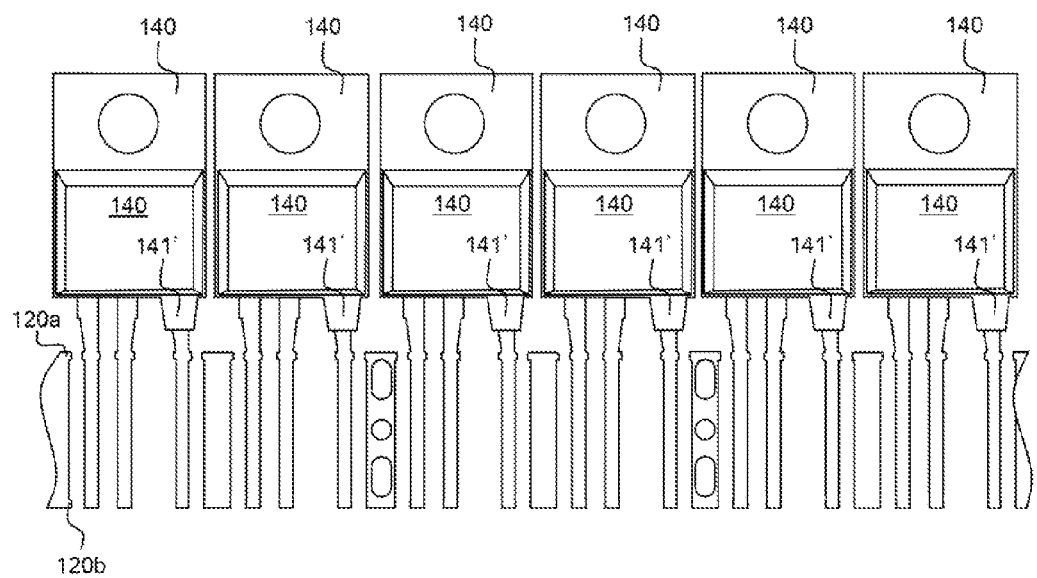

In an alternative embodiment, FIGS. 7A to 7B are similar as FIGS. 4B and 4C-1, the plastic package body 140 includes a plastic extension portion 141' with the length of the plastic extension portion 141' extending along the length direction of lead shoulder 1511 being smaller than that of plastic extension portion 141 in FIG. 4B, thus, only a short portion of the lead shoulder 1151 close to edge 111a is encapsulated by the plastic extension portion 141' while a long portion of the lead shoulder 1151 close to lead terminal 1152 is exposed out of the plastic extension portion 141'. In another embodiment, optionally, for the leads 113-114, a smaller part of the lead shoulder 1131 (or 1141) near its bonding area 1130 (or 1140) can also be encapsulated by a short plastic extension portion (not shown), similar as the plastic extension portion 141', in the molding process, while a larger part of the lead shoulder 1131 (or 1141) near its lead terminal 1132 (or 1142) is exposed out of the short plastic extension portion (not shown). In other words, the creep-age distance can be adjusted by the way of changing the length of the plastic extension portion 141'.

Figure 8A:
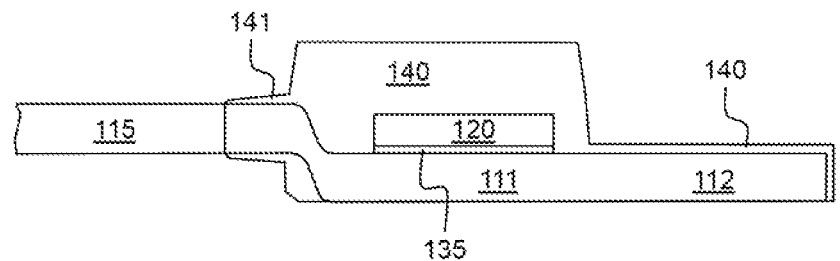
FIGS. 8A-8B are schematic structural diagrams of the device with the bottom surface of the die paddle exposed from the plastic package body.
Figure 8B:
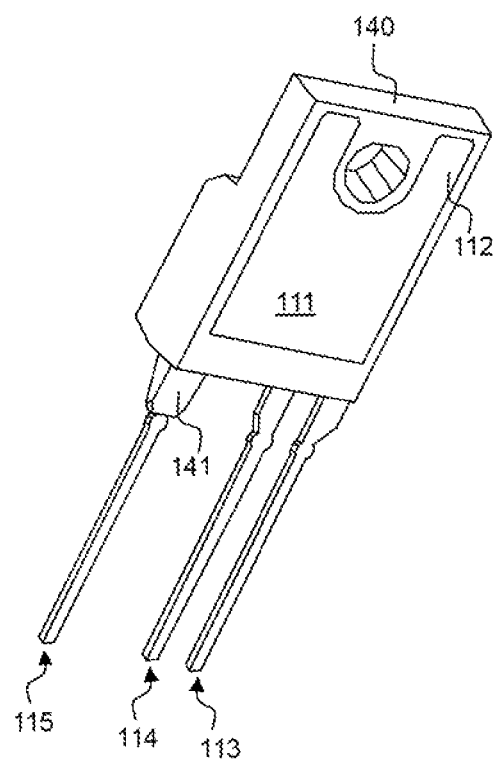

In an alternative embodiment, FIGS. 8A to 8B are also similar as FIGS. 4C-2 and 4C-3, which can be formed with the same process as shown in FIGS. 4A to 4C-3, excepting that the die paddle 111, the heat sink 112, the chip 120, the bonding wires 130 and the bonding areas 1130 and 1140 are encapsulated by the plastic package body 140 in the step of molding process but the bottom surfaces of the die paddle 111 and the heat sink 112 are exposed out from the bottom surface of the plastic package body 140 to provide a better heat dissipation for the chip 120.

Figure 9A:
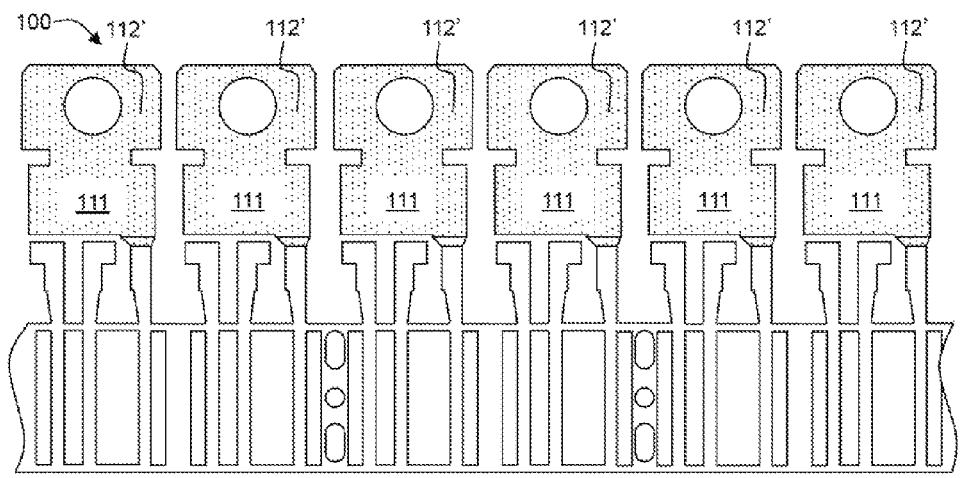
FIGS. 9A-9D are schematic diagrams of a device having the bottom surface of the die paddle and a whole heat sink exposed from the plastic package body.
Figure 9B:
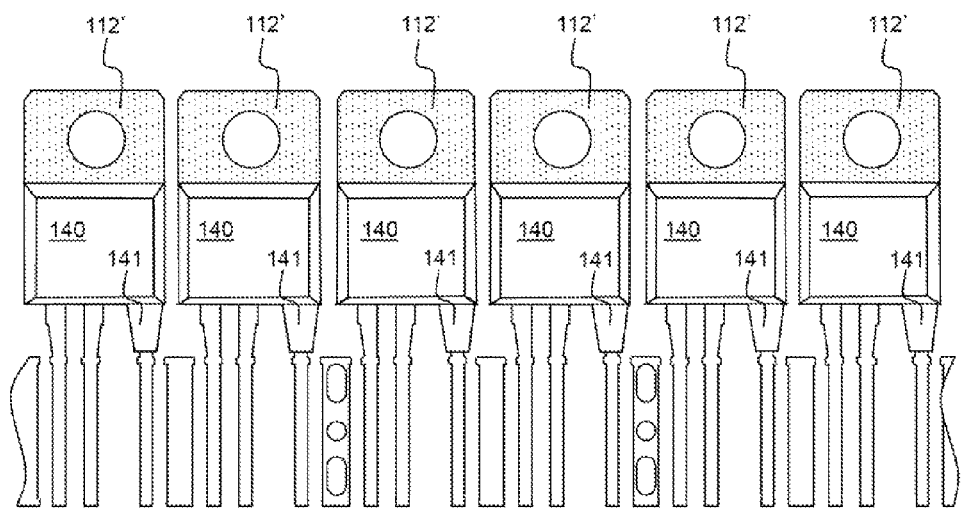
Figure 9C:
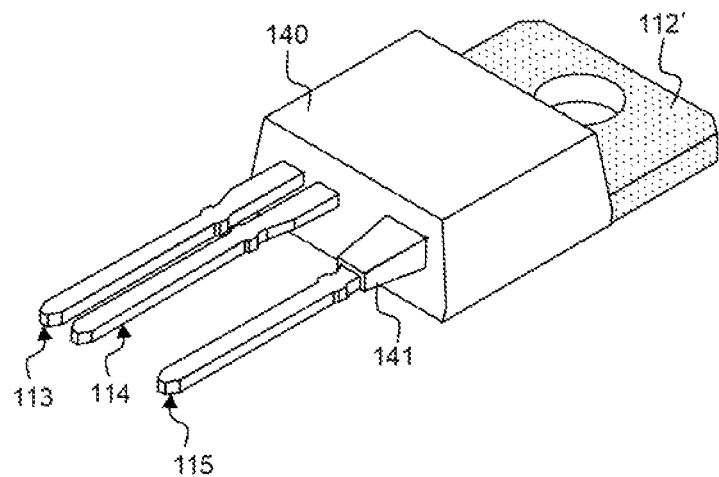
Figure 9D:
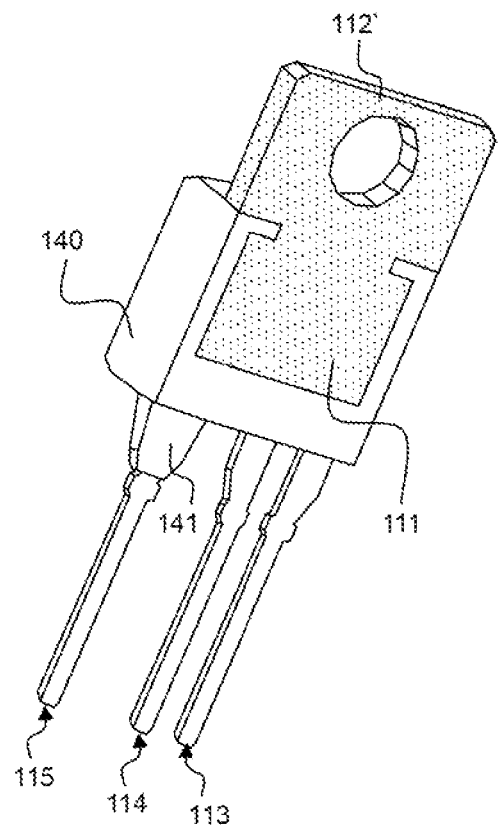

In another alternative embodiment, FIGS. 9A to 9B are also similar as FIGS. 4B and 4C-1, which can be formed with the same process as shown in FIGS. 4A to 4C-3, but the difference is that the heat sink 112' is a conventional square shape with a circular hole. As shown in FIG. 9A, the heat sink 112' is connected with the other side edge of the die pad 111 opposite to the side edge 111a connected with the lead 115. And in the step of forming the plastic package body 140, as shown in FIGS. 9B to 9C, the die paddle 111, the chip 120, the bonding wires 130 and the bonding areas 1130 and 1140 are encapsulated by the plastic package body 140, while the whole heat sink 112' is completely exposed out of the plastic package body 140, and moreover, the bottom surface of the die paddle 111 is exposed out of one bottom surface of the plastic package body 140, as shown in FIG. 9D.

Figure 10A:
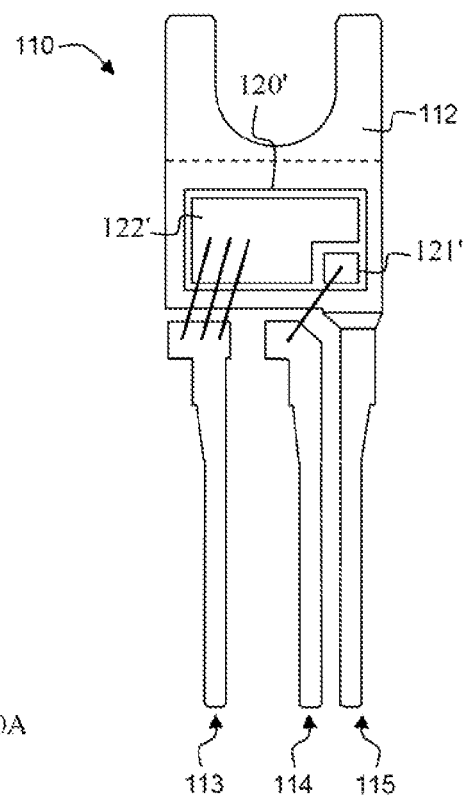
FIGS. 10A-10D are schematic diagrams showing different configurations of the device with one lead separated from the die paddle close to the lead connected with the substrate.
Figure 10B:
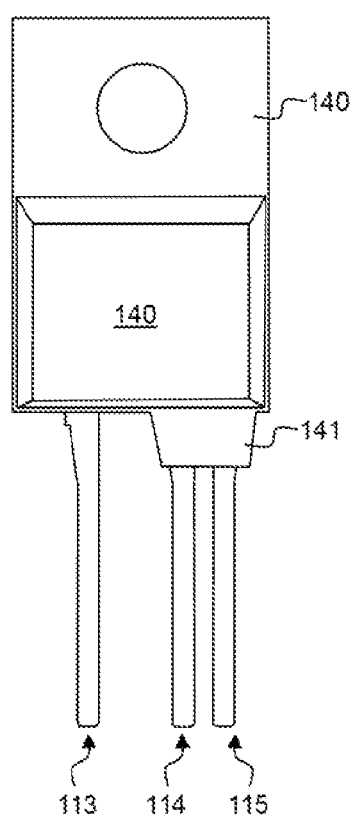
Figure 10C:
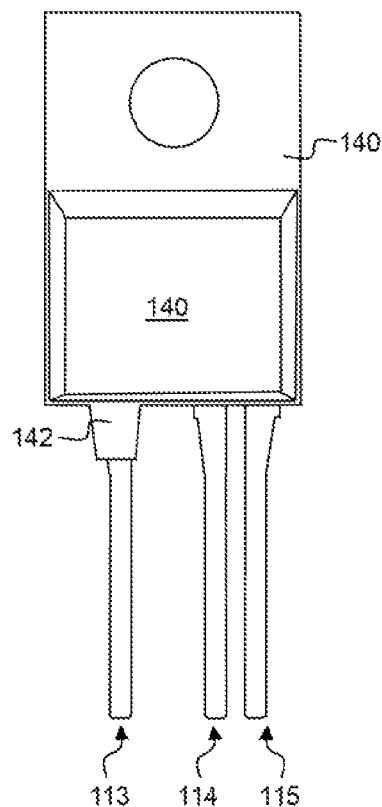
Figure 10D:
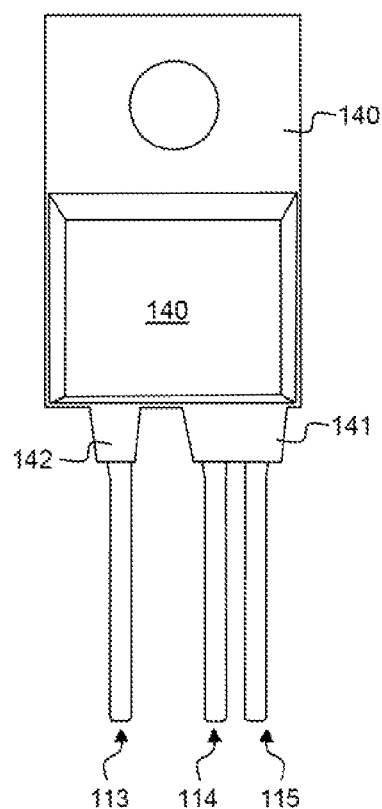

In an embodiment of FIG. 10A, the position of the lead 114, comparing with that in FIG. 3A, is adjusted, where the inner lead 114 is not adjacent to the outer lead 113, but is far away from the lead 113 and close to the lead 115. Leads 114, 115 are arranged close to each other so that the distance between lead 114 and lead 115 is reduced to extent minimum distance, and the leads 114, 115 together form a designated group of leads, such as group of leads 113 and 114, where the distance between the two adjacent leads 114 and 115 is smaller than the distance between any one of leads (114 or 115) of the group of leads and the lead 113 of the plurality of leads 113-115, so the plurality of leads 113-115 are arranged in a non-equidistant manner. In this embodiment, a vertical P-MOSFET chips 120' is replaced for the N-MOSFET chip 120, and the source electrode of P-MOSFET is generally connected to a high voltage while the drain electrode and the gate electrode are connected with low voltage. A gate electrode 121' disposed on the front-side of the chip 120' is in electric connection with the bonding area 1140 of the lead 114 via the bonding wire, a source electrode 122' disposed on the front-side of the chip 120' is in electric connection with the bonding area 1130 of the lead 113 via the bonding wires 130, so the lead 113 is connected to the high voltage, and furthermore, the bottom drain electrode disposed on the backside of chip 120' is electrically connected with the die paddle 111 and the lead 115. The distance between the source electrode and the drain electrode can be extended as long as the distance between group of leads 114, 115 and lead 113 is increased, which improves the creep-age distance. The lead 114 can be arranged closest to the lead 115, which relies on the technology precision of the punching equipment or the etching equipment for manufacturing the lead frame. In addition, the angle portions can be arranged on one side edge or both side edges of the lead shoulders 1131-1151, or the angle portion can be omitted, which has been explained in the above embodiments. In an alternative embodiment as shown in FIG. 10B, at least a part of the lead shoulder 1151 of the lead 115 connected with the die paddle 111 is encapsulated by the plastic extension portion 141, and at least a part of the lead shoulder 1141 of the lead 114 separated from the die paddle 111 and close to the lead 115 is also encapsulated by the plastic extension portion 141 as well, while the lead shoulder 1131 of the lead 113 separated from the die paddle 111 and far away from the group of leads 114, 115 is not encapsulated by any plastic extension portion. In an alternative embodiment shown in FIG. 10C, at least a part of the lead shoulder 1131 of the lead 113 separated from the die paddle 111 and far away from the group of leads 114, 115 is encapsulated by the plastic extension portion 142, while the lead shoulder 1141 of the lead 114 and the lead shoulder 1151 of the lead 115 are not encapsulated by any plastic extension portion. Alternatively, as shown in FIG. 10D, the lead shoulders 1141-1151 are either partly or completely encapsulated by the plastic extension portion 141 respectively, and the lead shoulder 1131 is partially or completely encapsulated by the plastic extension portion 142 as well.

The chips 120 and 120' can also be an IGBT, in which the lead 114 serves as the gate lead and the leads 113 and 115 are functioned as collectors or emitters of the IGBT. If the pluralities of leads are arranged side by side with equidistance, and a source or drain electrode with high voltage level is connected with the inner lead of the leads arranged side by side, the creep-age distance will be reduced as the distance between the inner lead and outer leads is very short, which is contrary to the spirit of the present invention. In addition, if the pluralities of leads are arranged side by side with equidistance and the lead shoulder of each lead is encapsulated by single plastic extension portion of a plastic package body, it is theoretically possible, but the improvement of the creep-age distance is very limited because when the inner lead of the leads arranged side by side is connected with high voltage level, the distance between the inner lead and outer leads is still very short, and even if the outer lead is connected with high voltage, the creep-age distance is still very small. Moreover, if the two adjacent leads are closer to each other and the lead shoulders of the two leads are encapsulated by the plastic extension portion respectively, the spacing clearance between the two adjacent leads should be big enough to insert the plastic extension portion into the limited space between the two adjacent leads, however if the spaces between two adjacent leads is increased to satisfy the requirement of forming a plastic extension portion for each lead shoulder, the package size is also increased to meet the required spacing clearance, with the costs being increase and the performance of the package is adversely affected. Obviously, these methods are not in the scope of the present invention, in which the lead shoulder of each lead of the designated group of leads is encapsulated by a plastic extension portion, or/and each lead shoulder of the remaining leads, not belong to the group of leads, is encapsulated by another plastic extension portion, the method of present invention obtains a better creep-age distance effect.

Above of all, the descriptions of the specific embodiments and typical embodiments are given, but these contents are not used as limit. For those skilled in the art, various modifications and variations are undoubtedly obvious after reading the above-mentioned specification. Consequently, the claims appended hereto should be regarded as all variations and modifications covering the real intention and the scope of the present invention. In the scope of the claims, any and all equivalent scopes and contents should be considered still belonging to the intension and the scope of the present invention.

What is claimed is:

1. A power semiconductor device comprising:
   a chip mounting unit with a die paddle and a plurality of leads arranged side by side located close to one side edge of the die paddle, a first lead of the plurality of leads connecting to the die paddle, a second and a third leads of the plurality of the leads separating from the die paddle, each of the second and third leads having a bonding area at an end close to the die paddle wherein the second lead being adjacent to the first and the third leads respectively and the first, the second and the third leads being disposed in a non-equidistant manner;
   a semiconductor chip mounting on the die paddle having a first electrode disposed at a backside of the semiconductor chip in electric connection with the die paddle through a conductive material, and a second and a third electrodes disposed at a front-side of the semiconductor chip opposite the backside of the semiconductor chip respectively in electric connection with respective bonding areas of the second and third leads through conductive structures; and
   a plastic package body encapsulating the die paddle, the semiconductor chip, the conductive structures and the bonding areas of the second and third leads, wherein the plastic package body further comprises a plastic extension portion extending along a length of one of the first, second and third leads.

2. The power semiconductor device of claim 1, wherein the third lead being displaced from the second lead closer than the first lead being displaced from the second lead.

3. The power semiconductor device of claim 2, wherein an edge of the second lead adjacent to the third lead extending substantially parallel to an edge of the third lead adjacent to the second lead along a substantial length of the second lead from inside the plastic package body to outside the plastic package body.

4. The power semiconductor device of claim 2, wherein the plastic extension portion extends along a length of the second and third leads.

5. The power semiconductor device of claim 2, wherein an edge of the second lead adjacent to the first lead comprises an angel portion moving close to the first lead while moving close to the die pad.

6. The power semiconductor device of claim 1, wherein the first lead being displaced from the second lead closer than the third lead being displaced from the second lead.

7. The power semiconductor device of claim 6, wherein an edge of the second lead adjacent to the first lead extends substantially parallel to an edge of the first lead adjacent to the second lead along a substantial length of the second lead from inside the plastic package body to outside the plastic package body.

8. The power semiconductor device of claim 6, wherein the plastic extension portion extends along a length of the first and second leads.

9. The power semiconductor device of claim 6, wherein an edge of the second lead adjacent to the third lead comprises an angel portion moving close to the third lead while moving close to the die pad.

10. The power semiconductor device of claims 1, wherein the semiconductor chip is a power MOSFET (Metal-Oxide-Semiconductor Field Effect Transistor) or an IGBT (Insulated Gate Bipolar Transistor), the first electrode thereof is a drain electrode and of the second and third electrodes at the front-side of the semiconductor chip comprise source and gate electrodes.

11. An assembly method of a power semiconductor device comprising the following steps:

providing a lead frame with a plurality of chip mounting units, wherein each chip mounting unit comprises a die paddle and a plurality of leads arranged side by side located close to one side edge of the die paddle, a first lead of the plurality of leads connecting to the die paddle, a second and a third leads of the plurality of the leads separating from the die paddle, each of the second and third leads having a bonding area at an end close to the die paddle, wherein the second lead being adjacent to the first and the third leads respectively and the first, the second and the third leads being disposed in a non-equidistant manner;

attaching a semiconductor chip to the die paddle so that a first electrode disposed at a backside of the semiconductor chip is in electric connection with the die paddle through a conductive material;

electrically connecting a second and a third electrodes disposed at the front-side of the semiconductor chip with respective bonding areas of the second and third leads through conductive structures;

forming a plastic package body to encapsulate the die paddle, the semiconductor chip, the conductive structures and the bonding area of each lead separated from the die paddle, wherein the plastic package body at least comprises a plastic extension portion extending along a length of one of the first, second and third leads; and cutting the lead frame to separate individual chip mounting units.

12. The method of claim 11, wherein the third lead being displaced from the second lead closer than the first lead being displaced from the second lead.

13. The method of claim 12, wherein an edge of the second lead adjacent to the third lead extending substantially parallel to an edge of the third lead adjacent to the second lead along a substantial length of the second lead from inside the plastic package body to outside the plastic package body.

14. The method of claim 12, wherein the plastic extension portion extends along a length of the second and third leads.

15. The method of claim 12, wherein an edge of the second lead adjacent to the first lead comprises an angel portion moving close to the first lead while moving close to the die paddle.

16. The method of claim 11, wherein the first lead being displaced from the second lead closer than the third lead being displaced from the second lead.

17. The method of claim 16, wherein an edge of the second lead adjacent to the first lead extends substantially parallel to an edge of the first lead adjacent to the second lead along a substantial length of the second lead from inside the plastic package body to outside the plastic package body.

18. The method of claims 16, wherein the plastic extension portion extends along a length of the first and second leads.

19. The method of claim 16, wherein an edge of the second lead adjacent to the third lead comprises an angel portion moving close to the third lead while moving close to the die pad.

20. The method of claims 11, wherein the semiconductor chip is a power MOSFET (Metal-Oxide-Semiconductor Field Effect Transistor) or an IGBT (Insulated Gate Bipolar Transistor), the first electrode thereof is a drain electrode and of the second and third electrodes at the front-side of the semiconductor chip comprise source and gate electrodes.

* * * * *